(12) United States Patent
Kaczynski

(10) Patent No.: US 8,362,843 B2
(45) Date of Patent: Jan. 29, 2013

(54) METHOD AND APPARATUS FOR MULTI-POINT CALIBRATION FOR SYNTHESIZING VARYING FREQUENCY SIGNALS

(75) Inventor: Brian Kaczynski, Cracow (PL)

(73) Assignee: QUALCOMM Incorporated, San Diego, CA (US)

( * ) Notice: Subject to any disclaimer, the term of this patent is extended or adjusted under 35 U.S.C. 154(b) by 33 days.

(21) Appl. No.: 12/971,993

(22) Filed: Dec. 17, 2010

(65) Prior Publication Data
US 2012/0154064 A1    Jun. 21, 2012

(51) Int. Cl.
*H03L 7/099* (2006.01)
(52) U.S. Cl. ...... 331/16; 331/179; 331/36 C; 331/177 V
(58) Field of Classification Search ............ 331/16, 331/36 C, 179, 177 V
See application file for complete search history.

(56) References Cited

U.S. PATENT DOCUMENTS

| 7,119,624 B2 * | 10/2006 | Gomez ........................... 331/16 |
| 2003/0042985 A1 | 3/2003 | Shibahara et al. |
| 2005/0083137 A1 | 4/2005 | Lee et al. |
| 2006/0211393 A1 | 9/2006 | Chien |

FOREIGN PATENT DOCUMENTS

| EP | 1460762 A1 | 9/2004 |
| GB | 2413019 A | 10/2005 |

OTHER PUBLICATIONS

International Search Report and Written Opinion—PCT/US2011/065671—ISA/EPO—Mar. 19, 2012, 11 pages.

\* cited by examiner

*Primary Examiner* — Arnold Kinkead
(74) *Attorney, Agent, or Firm* — DeLizio Gilliam, PLLC

(57) ABSTRACT

A fast settling frequency synthesizer is disclosed. The particular capacitor to frequency relationship in the band of operation is first determined. The calculation can be performed by determining the capacitor to frequency relationship at two points and calculating the slope. Once these parameters are known, then, for any change in frequency due to a channel hop, the appropriate capacitor value can be determined.

27 Claims, 12 Drawing Sheets

| Input | Bit Width | Description |
|---|---|---|
| VcoCap0 1010 | 7 | Reference VcoCap value (used if OvrCal = 1) VcoCap holds computed value at the end of CAP_SEARCH process. |
| Freq0 1020 | 15 | Initial frequency used to derive VcoCap0 during calibration, 9 bits are integer, 6 bits are fractional. Freq holds computed value at the end of FREQ_SEARCH process. |
| FDiff16 1030 | 10 | Initial guess at frequency difference for capacitor difference of 16. 4 bits are integer and 6 bits are fractional. Holds computed value at the end of SLOPE_SEARCH process. |
| OvrCal 1040 | 1 | Override calibration. If asserted, the values for VcoCap0, Freq0 and FDiff16 are taken from a shift register. |
| WaitCalSettle 1050 | 6 | One wait period for all changes (Frequency or Capacitor change). Such a wait period allows the circuit to settle. |
| SynthOn 1060 | 1 | Indicates the normal operation state of the synthesizer. |
| SynthCal 1070 | 1 | Indicates that the synthesizer has to calibrate. |
| ResetB 1080 | 1 | Active low reset. |
| ChUpdate 1090 | 1 | Indicates change in channel or equivalently a channel hop in any network architecture. |
| Vc2High 1095 | 1 | Indicate that VCO voltage is greater than a set threshold. |
| Vc2Low 1085 | 1 | Indicate that VCO voltage is less than a set threshold. |
| ForceVcoCap 1075 | 1 | VCO Capacitor value is forced as initial parameter. |

FIGURE 10

| Parameter | Bit Width | Description |
|---|---|---|
| BitIndex 1100 | 5 | Inner Loop Repeat Value for Processes. Participates in the termination test. |
| PinVc 1110 | 1 | Controls if VCO voltage is forced to target (for desired frequency) or if it is determined by the synthesizer. |
| Freq 1120 | 15 | Variable holding computed frequency during iteration. |
| VcoCap 1130 | 7 | Variable holding computed capacitor during iteration. |

FIGURE 11

METHOD AND APPARATUS FOR MULTI-POINT CALIBRATION FOR SYNTHESIZING VARYING FREQUENCY SIGNALS

FIELD

This invention relates to frequency synthesizers. In particular, it discloses a multi-point calibration process to compute parameters for varying the response frequency in a PLL based frequency synthesizer.

BACKGROUND

The Bluetooth standard is a specification directed to Wireless Personal Area Networks (WPAN). Bluetooth provides short-range radio links to replace wires between computers and their peripherals, cell phones and ear pieces, etc. Typically, Bluetooth products are designed for transmitting relatively small amounts of data (at 1 Mbps) over short distances (up to 10 meters). Consequently, Bluetooth products do not require much power to operate. This conserves battery life. However, the low signal power is susceptible to noise and other factors that could interfere with and/or otherwise degrade the signal. In order to increase reliability, without consuming more power, Bluetooth utilizes a frequency hopping scheme. The signal intentionally changes or "hops" to different frequencies when transmitting or receiving data packets. This frequency hopping scheme is implemented by 79 hops displaced by 1 MHz, from 2.402 GHz to 2.480 GHz. Hopping in and out of a continuous range of frequencies affords the established communication link an opportunity to recover from errors and also makes the link more robust.

The Bluetooth protocol requires that a connection, also referred in Bluetooth technology as a pico-net, is first established between two or more units. The master-unit determines a frequency-hopping scheme. This scheme is then transmitted to the other units. The frequency selection scheme consists of two parts: selecting a sequence and subsequently mapping the sequence onto hop frequencies. Consequently, the frequency hopping scheme requires that the Bluetooth radio be able to operate at hopped frequencies. It also requires that when a hop to a new frequency occurs, the radio recognizes the change and settles quickly to it. The faster settling time is important because it translates into a shorter delay when hopping between frequencies. For Bluetooth and other wireless systems, the specified settling time can be in the range of 20 microseconds.

An ideal method for implementing a frequency synthesizer that meets the requirements of Bluetooth takes the form of a Phase Locked Loop (PLL). Besides inherently having a fast settling time, a PLL frequency synthesizer has a relatively high degree of stability and accuracy as compared to other forms of local oscillators. Furthermore, PLL frequency synthesizers are easily controlled by digital circuitry, such as microprocessors. It is for these reasons that a PLL frequency synthesizer is used in virtually every Bluetooth device.

In many instances, a capacitor array is implemented in order to provide for a variable PLL frequency synthesizer that can be used to synthesize frequencies over a specified band of frequencies. In order to lock a variable frequency synthesizer to a desired frequency, the appropriate capacitor is selected for use from the given array. There exist two methods for choosing the appropriate capacitor. In a binary search plus an optional linear search method (the "first" method), each time the channel is changed, the synthesizer performs a binary search on the capacitor array in order to find the correct setting. The second method uses a "Boundary Search" process. On power up, the synthesizer is calibrated by sweeping the entire frequency band and saving the frequencies whereby the capacitor setting needs to change by 1 LSB. This requires a large table of frequency versus capacitor settings.

The first method suffers from the fact that the binary search on each channel takes a long time to perform. In the second method, the required calibration time is prohibitive. Furthermore, the second method requires a large amount of silicon storage, which increases cost and size. Thus, although the two approaches offer solutions, they nonetheless suffer disadvantages, and neither one is optimal.

SUMMARY

This invention discloses a process to calibrate a synthesizer deployed in a RF transceiver. One embodiment of the process makes the synthesizer converge or settle faster than the conventional schemes. On power-up, the synthesizer is first calibrated by setting the frequency above the maximum channel in the signal band. A binary search is performed to find a proper capacitor setting. At that setting, the process performs a binary search for the capacitor setting to fine-tune the frequency and locate the exact frequency where the capacitor setting transition would occur. The process increases the capacitor setting by a power of two, thereby lowering the frequency to be inside the signal band. It performs a second binary search on the frequency to locate the exact frequency where the second capacitor transition occurs. Due to an approximate linear relationship between the frequency and capacitor in the band of interest and the change in the capacitor value chosen so as to minimize the deviation from linear behavior, all frequency to capacitor relationships become known. By conducting only two searches and an interpolation, the process results in fast settling times and is implemented by a low gate count.

BRIEF DESCRIPTION OF THE DRAWINGS

The accompanying drawings are incorporated in and form a part of this specification. The drawings illustrate embodiments. Together with the description, the drawings serve to explain the principles of the embodiments.

FIG. 10 itemizes input signals to the state machine implementation.

FIG. 11 itemizes critical parameters initialized, changed and sampled by the state machine in various stages.

DETAILED DESCRIPTION

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "accessing," "receiving," "sending," "setting," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The invention, in one embodiment, is deployed in a wireless receiver to provide a mechanism to select appropriate capacitor values in order to effectuate desired frequency changes. A first value of the capacitor is chosen from a capacitor array such that the frequency of the apparatus is outside the band of operation. The frequency is then adjusted, and the corresponding control/error voltage is examined to determine the exact transition point whereby the capacitor array will next need to change. A second value of the capacitor is chosen from the capacitor array, which causes the apparatus to oscillate approximately in the middle of the band. The frequency is adjusted again, and the control/error voltage is subsequently examined to determine the capacitor transition point. By determining these values, a relationship between the frequency of oscillation and the capacitor value can be established. Thereby, a proper capacitor setting can be chosen for any desired frequency setting in the band of operation.

Figure 1:
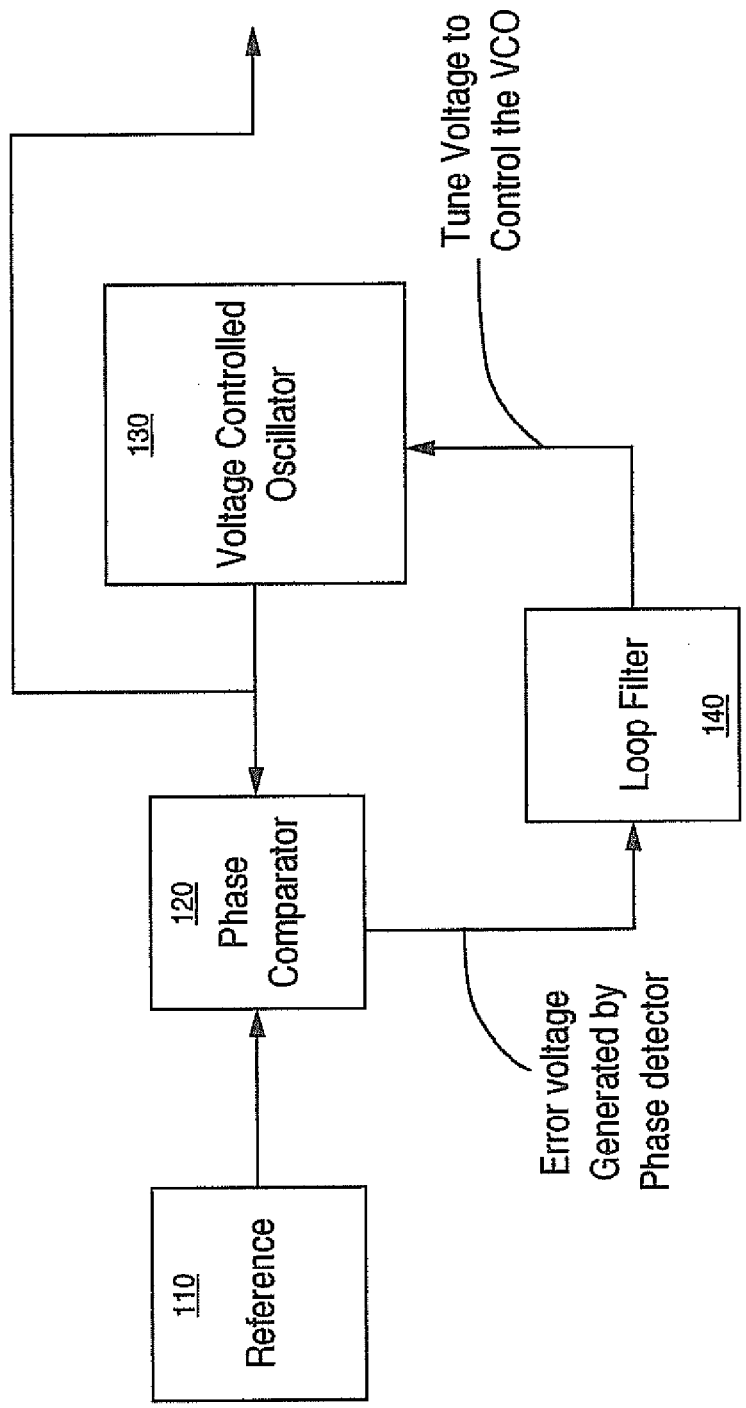
FIG. 1 is a basic block diagram of a basic PLL.

FIG. 1 represents an exemplary Phase Locked Loop circuit (PLL). The purpose of the PLL is to generate a signal at a precise frequency. For this reason, PLLs are commonplace as source clock generators in integrated circuits. They are also used for precise clock generation for communication transmission and reception. A PLL inputs a reference clock from a reference source 110. A reference clock of precise frequency is constantly compared with the output of a voltage controlled oscillator (VCO) 130. A voltage controlled oscillator is an electrical analog device that generates a signal at a certain frequency which is related to the voltage of the input applied to it. The phase comparator 120 compares the phases of the reference 110 and the VCO 130 to generate an error signal. The error signal is filtered in a loop filter 140 to provide the voltage input to the VCO 130. The output of VCO 130 is the frequency locked output of the PLL.

Figure 2:
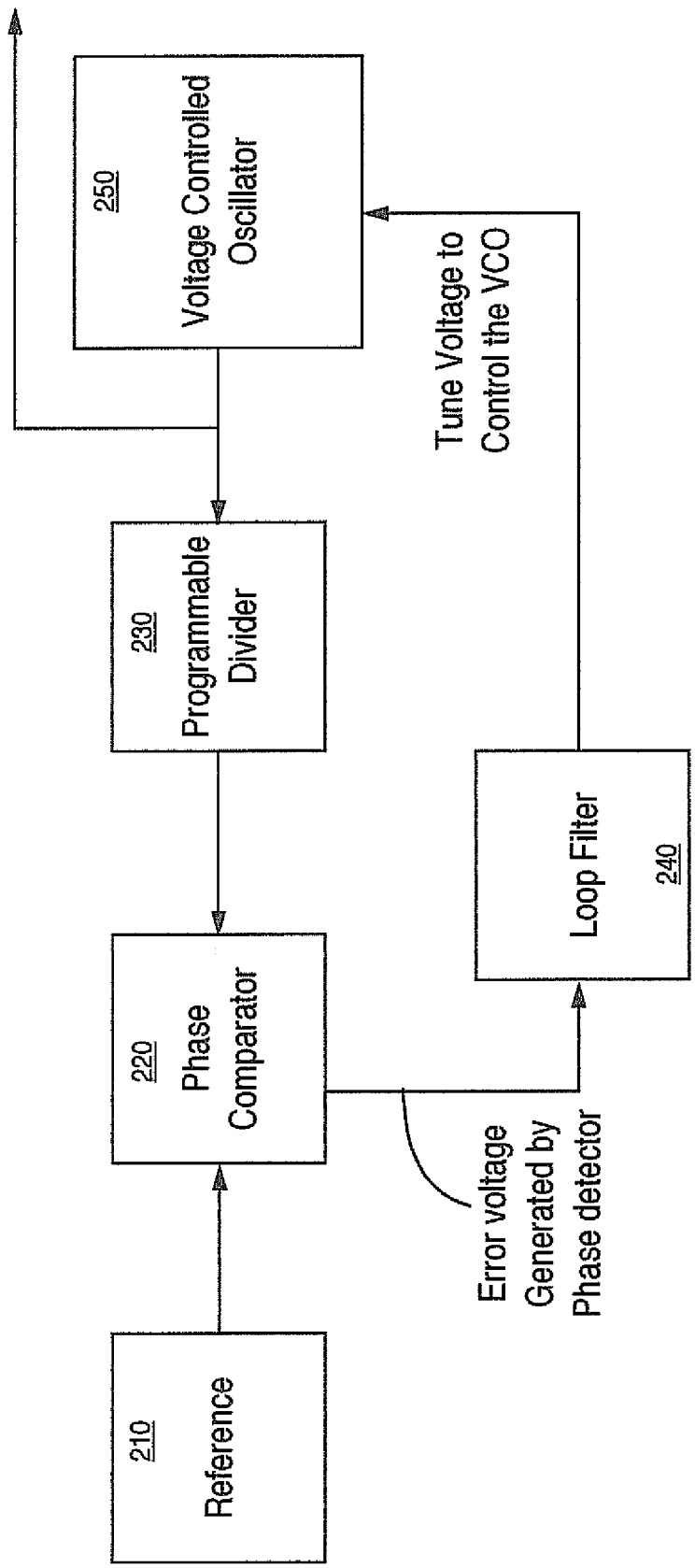
FIG. 2 is a block diagram of a PLL with a programmable divider.

FIG. 2 represents an exemplary programmable frequency synthesizer. Similar to FIG. 1, the synthesizer has a reference source 210, a phase comparator 220, a loop filter 240 and a VCO 250. In addition, the programmable frequency synthesizer has a programmable divider 230. It is placed between the VCO 250 and phase comparator 220 to control the frequency of the signal generated by the VCO 250. A count is input to the programmable divider through a microprocessor or some other programmable device under software control. The PLL of FIG. 1 is capable of generating varying frequency outputs.

Figure 3A:
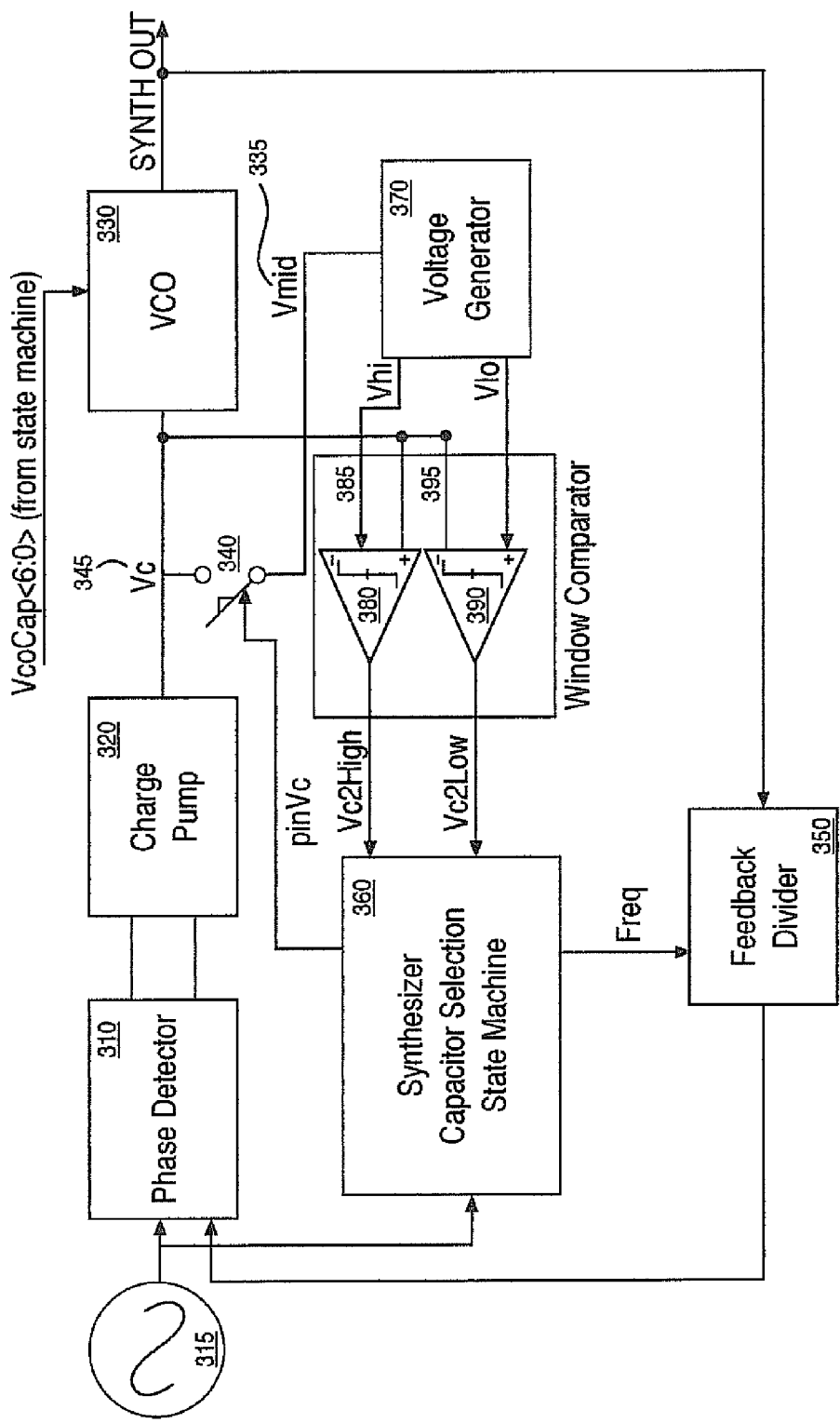
FIG. 3A is an example of a 2.4 GHz CMOS synthesizer for Bluetooth.

FIG. 3A represents an exemplary Bluetooth synthesizer. The phase frequency detector (PFD) 310 is equivalent to the phase comparator of FIG. 1 and FIG. 2. The output of the PFD 310 feeds into a charge pump block 320. The charge pump block generates a charge in proportion to a difference in phase, which is then filtered by the loop filter (not shown) to generate a VCO control voltage. As one embodiment of the present invention, a synthesizer capacitor selection state machine 360 can accept a plurality of inputs, including but not restricted to, outputs from a comparator apparatus 380 and 390 and a reference clock generator 315.

Figure 3B:
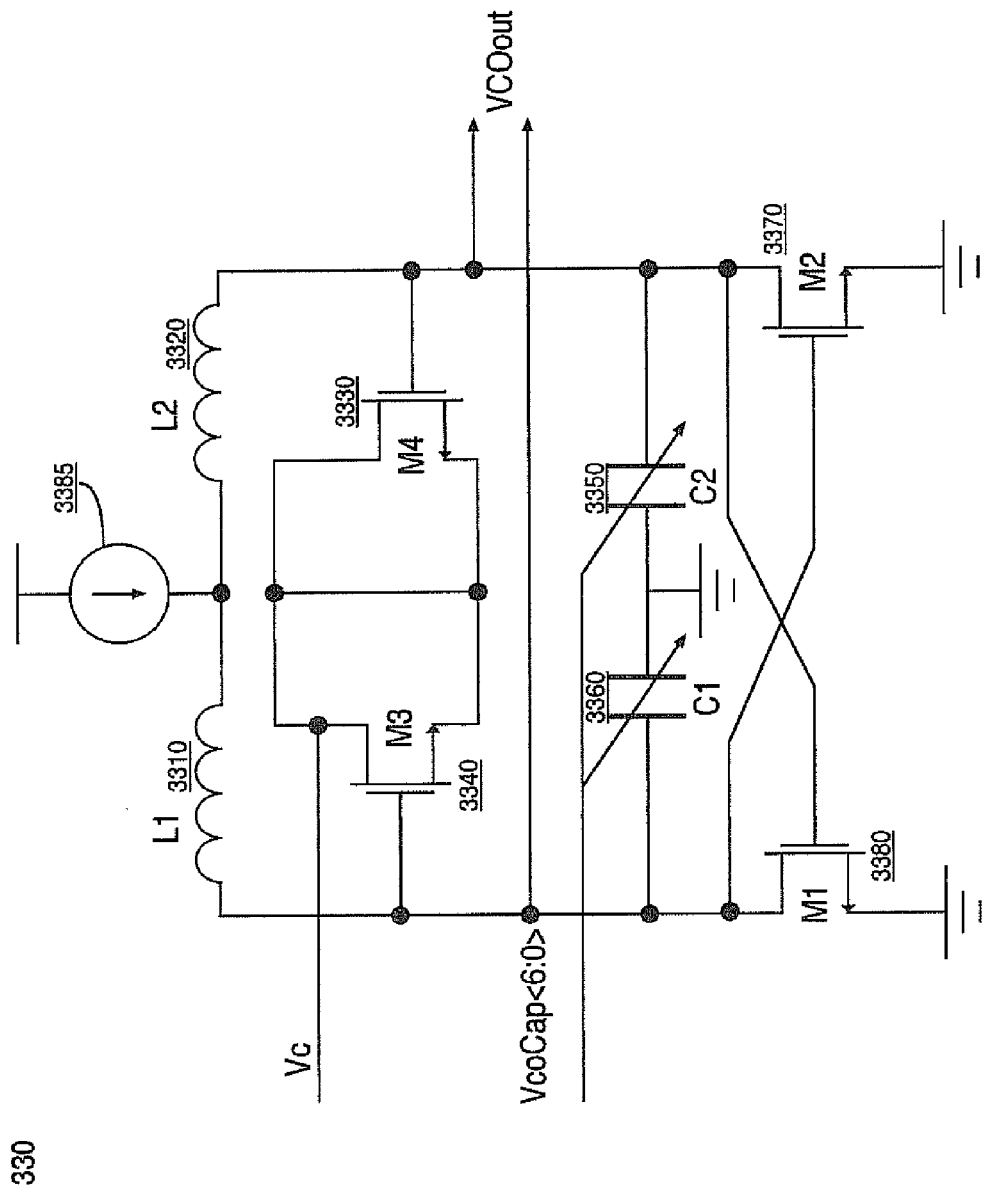
FIG. 3B is an embodiment of circuit implementation of a voltage controlled oscillator.

The VCO control voltage is input to a VCO 330. Besides the control voltage, the VCO 330 also accepts input VcoCap, which is an output of the selection state machine 360. In one embodiment of the present invention, this seven bit input controls the values of variable capacitors C1 3360 and C2 3350 inside the VCO apparatus as illustrated in FIG. 3B. Block 350 comprises components for controlling the generation of varying frequencies. The feedback divider 350 generates an appropriate frequency output based on the output "Freq" from the selection state machine 360. In an embodiment, the programmable feedback divider 350 has a fractional-N mode. A fractional-N synthesizer utilizes a sigma-delta modulator to generate a sequence of division ratios that has very low noise content at DC and can achieve much finer frequency resolution than a classical integer-N synthesizer. This fractional-N capability enables fine-tuning the frequency close to the capacitor transition points. In contrast, an integer-N synthesizer would not be able to tune the frequency with the desirable resolution of the fractional-N synthesizer.

A voltage generator 370 generates two reference voltages, Vhi and Vlo, which are compared against a set voltage at the input of the VCO 330. When required, an output from the voltage generator 370 can be applied to the input of the VCO 330 through an electronic switch 340. When the signal pinVc is set high, the switch is "on" and connects the voltage Vmid from the voltage generator 370 to the input of the VCO 330, holding the VCO control voltage Vc fixed to voltage Vmid. On the other hand, when the input pinVc is set low, the switch is "off" and the VCO input voltage becomes the voltage at node Vc 345. As part of the execution of the calibration process, the voltage Vc is controlled through switch 340. Referring again to FIG. 3A, pinVc is an output of the selection state machine. The VCO 330 is an inductor-capacitor (LC) oscillator. The frequency is proportional to the inverse square-root of the product of the inductor and capacitor values. Due to this inverse relationship, an increase in the capacitor value (e.g., C1 3360) reduces the oscillation frequency. Similarly, a decrease in the capacitor value increases the oscillation frequency. In one embodiment, the invention optimally selects, among other parameters, an appropriate capacitor value of C1 3360 and C2 3350, based on the frequency hop. The output of the apparatus "SYNTH_OUT" is the output of the frequency synthesizer. Thus, an example of the frequency synthesizer used to tune or change its frequency in response to channel selection changes is disclosed.

FIG. 3B further illustrates the VCO 330 of FIG. 3A in detail. In this embodiment, a design of a differential VCO in CMOS technology is illustrated. The VCO is identified as "differential" whereby it outputs a pair of signals, since the output of the VCO (and the synthesizer) is connected to mixers that need these two differential signals as an input. These mixers are identified as elements 460 and 470 of FIG. 4.

The main components of this exemplary oscillator are a set of capacitors (C1 3360 and C2 3350), inductors (L1 3310 and L2 3320) and transistors (M1 3380, M2 3370, M3 3340 and M4 3330). The capacitors and inductors are used to tune the oscillation frequency. The transistors M1 3380 and M2 3370 act as active elements to sustain the oscillation, whereas transistors M3 3340 and M4 3330 as varactors (or variable capacitors) which fine tune the oscillation frequency. The oscillator also has a current source 3385, which is used to bias the active elements (e.g., transistors) in the desired region of their characteristics to effectuate a proper incremental mode "active" behavior. In the semiconductor (CMOS) implementation of the VCO, a "tank" is formed by an inductor in parallel with a capacitor. Consequently, such a VCO may be identified in the art as a "LC-tank" VCO. Such a LC-tank VCO, generally, has superior phase noise and jitter performance at high frequencies, over other embodiments of the VCO.

It should be noted that the variable capacitor apparatus may also be identified, in the art, as a varactor. In one embodiment, the capacitors can be implemented using a MOS transistor in the accumulation region or a reversed-biased PN junction. Similarly, in one embodiment, inductors may be implemented, consistent with semiconductor technology, using a rectangular spiral metal. Top metal layers may be used to lower parasitic effects. The transistors (M1 3380, M2 3370) used in CMOS implementation of radio frequency components, generally, have high channel width. In an embodiment of the present invention, the frequency of the VCO is changed through the input VcoCap, a seven bit output from the selection state machine 360 of FIG. 3A.

It is to be noted by those skilled in the art, that the VCO of FIG. 3B is but one embodiment of the VCO and is presented as an illustration, rather than as a restriction. In so far as the frequency of the VCO can be controlled, for example, through changing a capacitor, embodiments of the present invention can be used to synthesize appropriate frequency signals with any embodiment of the VCO.

Figure 4:
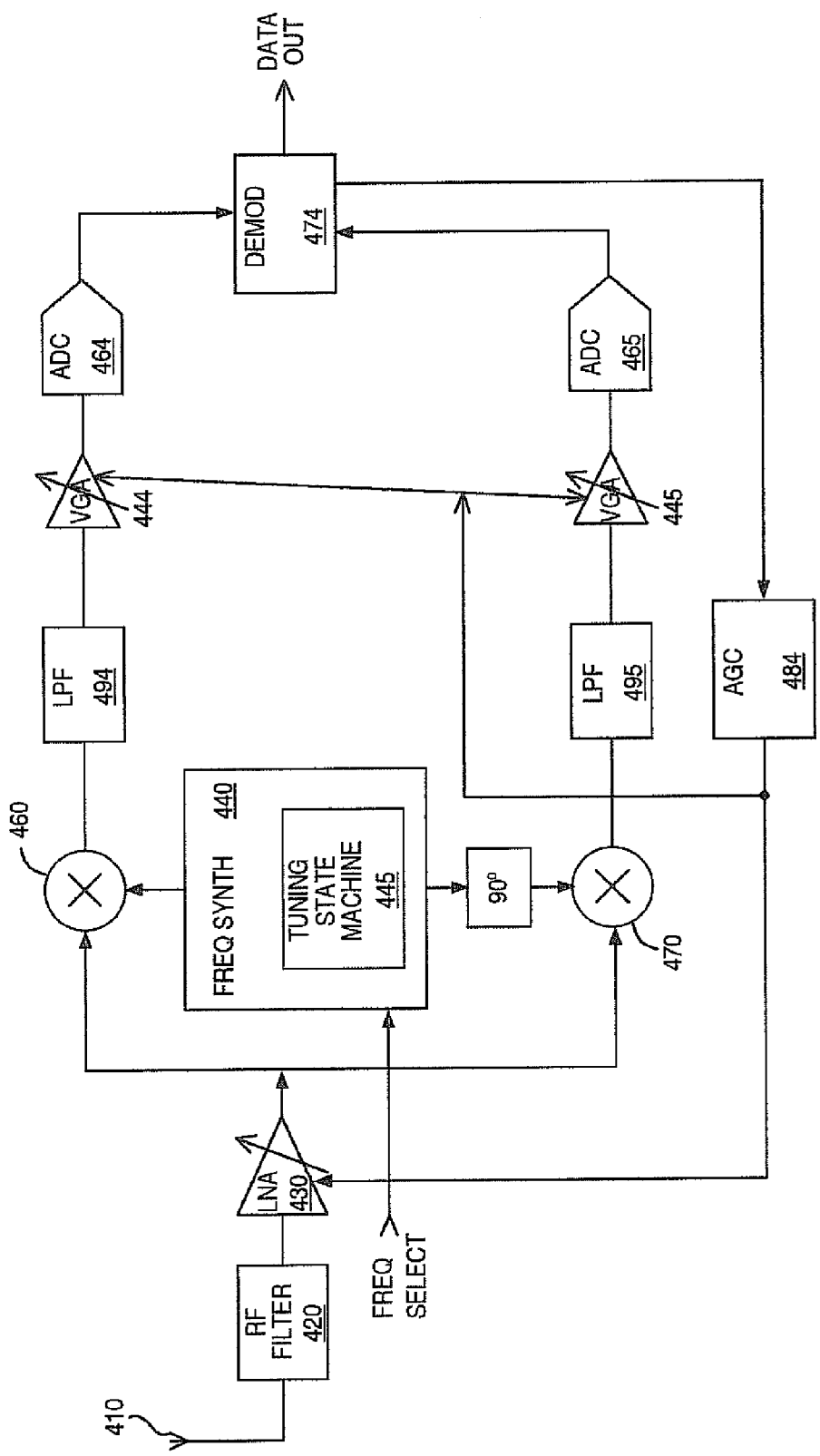
FIG. 4 is a Bluetooth Receiver Architecture diagram showing the context of the frequency synthesizer in the Bluetooth Receiver Architecture.

FIG. 4 represents a Bluetooth receiver architecture. Signals received through antenna 410 feed into an RF filter 420. RF filter 420 outputs to a low noise amplifier (LNA) 430. The amplified signal is split into in-phase and quadrature-phase components and mixed with the frequencies generated by the PLL frequency synthesizer 440 through the use of mixers 460 and 470.

The PLL frequency synthesizer 440, in one embodiment of the invention, has a tuning state machine 445. It down-converts the received signal into either an intermediate or a baseband frequency. The two phases of the signal (in the case of a direct conversion receiver) are each passed through a series of low pass filters 494 and 495; variable gain amplifiers 444 and 445; and analog-to-digital converters 464 and 465. The outputs of each ND converter 464 and 465 are passed to a baseband coprocessor, whereby it is digitally demodulated by demodulator 474 and then detected to recover the binary bit-valued data for further processing. The demodulator 474 also has a feedback path whereby its output is fed to the automatic gain controller (AGC) 484 and then back into the variable gain amplifiers 444 and 445 and low noise amplifier 430. Thus, this architecture discloses the use of a PLL frequency synthesizer 440 in an exemplary Bluetooth architecture.

Embodiments of the present invention disclose a process to choose the capacitor and fine tune the frequency in response to either a start up or power on state of the PLL frequency synthesizer or to a frequency hop executed under an exemplary network architecture. The process is presented and implemented in terms of a state machine which transitions between various states and executes various steps. Whereas an embodiment of the invention presents a hardware implementation of the state machine, the state machine could be implemented at any level of abstraction. Further, as known by artisans skilled in the art, the generation of the sequence of steps and signals may be implemented by alternate means, which may not be a finite state machine under some definitions in the art. Any means equivalent to a finite state machine constitute yet another embodiment of the present invention.

The process, implemented as a state machine, has several programmable inputs. The input labeled VcoCap0[6:0] 1010 represents the VcoCap 1130 reference value which is used if the state machine dependent calibration is to be overridden through an input. This is labeled as OvrCal 1040. The input labeled Freq0 1020 is a fifteen bit entity, consisting of 9 integer bits and 6 fractional bits. Freq0 1020 represents the initial guess frequency used to derive VcoCap0 1010 during calibration. The input labeled FDiff16 1030 is a ten bit entity, consisting of 4 integer bits and 6 fractional bits. This input represents the initial guess at the frequency difference for a capacitor difference of 16. The programmable input labeled WaitCalSettle[5:0] 1050 represents one wait period for all changes (e.g., a frequency or a capacitor setting). The state machine, in order to operate, requires an initial guess for the Freq0 1020 input and the FDiff16 1030 input. No initial guess is required for VcoCap0 1010. As already illustrated, there exists an inverse relationship between the frequency and the capacitor value. In one embodiment, Freq0 1020, in the initial guess, is greater than the highest Bluetooth band frequency of 2.48 GHz. These inputs are presented in FIG. 10.

The state machine has inputs that control the state of the frequency synthesizer, its reset, and for selection of the VCO capacitor. The input SynthOn 1060 is a single bit input which represents a power on for the frequency synthesizer. Similarly, input SynthCal 1070 is a single bit input which indicates that the frequency synthesizer should calibrate either for the first time or again for subsequent operations. This could be a programmable bit provided by the microprocessor. The input ForceVcoCap 1075 is a single bit input that fixes the selection of the VCO capacitor as opposed to calculating it within the process. These state and programmable inputs are specified in FIG. 10.

Figure 5:
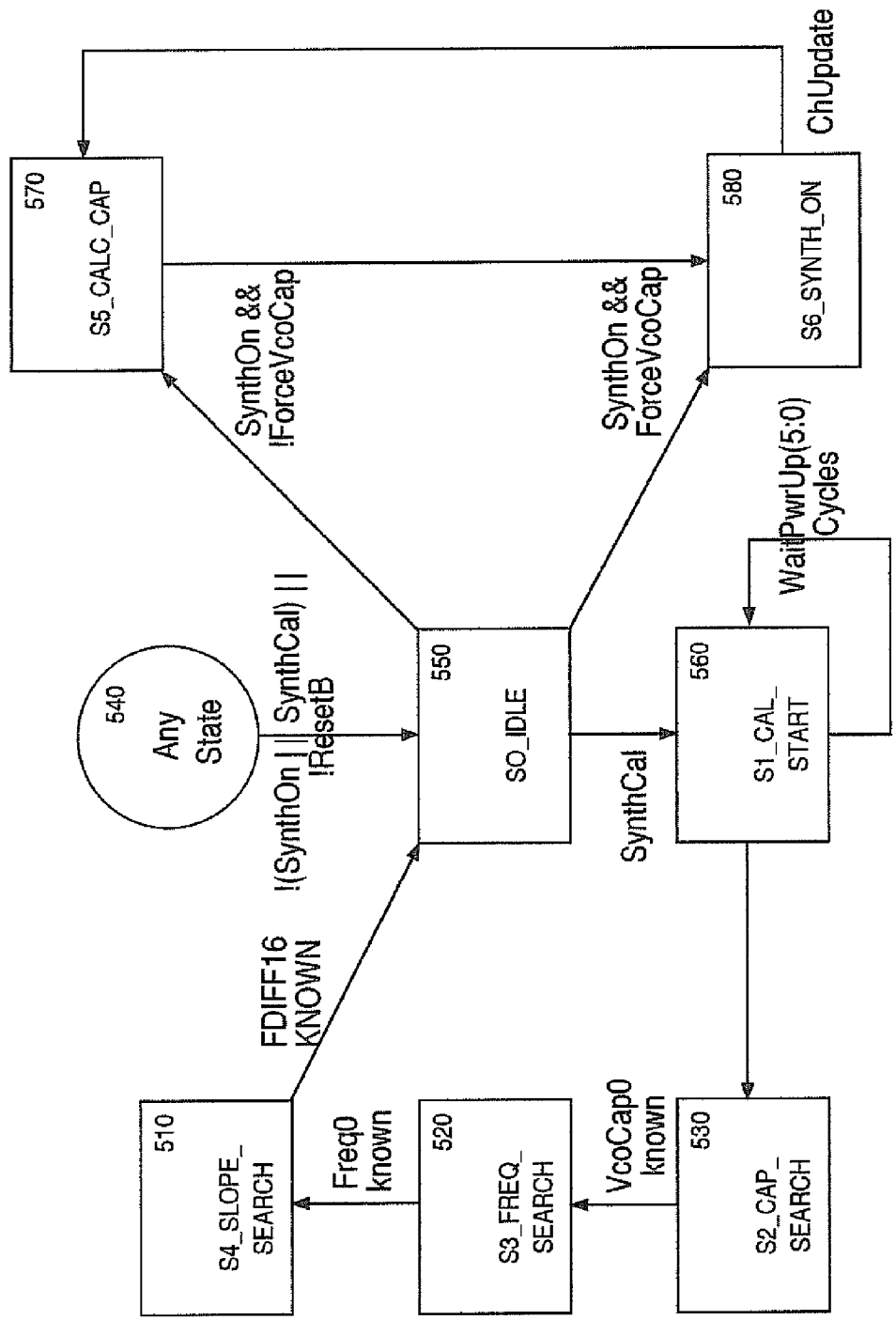
FIG. 5 represents a top level synthesizer state machine state diagram identifying various scenarios and steps in the calibration of the synthesizer.

In one embodiment of the invention, FIG. 5 shows the state and steps of the PLL frequency synthesizer state machine. Bubble 540 represents that the PLL frequency synthesizer could be in any state possible in the implementation of the process. From this "any state" bubble 540, the state machine can enter the S0_IDLE ("idle") state 550 on assertion of reset, as indicated by a low ResetB 1080, or S0_IDLE ("idle") state 550 could be entered if the PLL frequency synthesizer is off and the PLL frequency synthesizer is not in the calibration mode. This implies that the inputs SynthOn 1060 and SynthCal 1070 are both off.

From state S0_IDLE ("idle") 550, the state machine has two major sections. The first major section of the state machine is triggered when the synthesizer has to calibrate or recalibrate. This process leads to an iterative process to determine VcoCap0 1010, Freq0 1020 and FDiff16 1030. The state machine transitions from S0_IDLE ("idle") 550 to:

(a) S1_CAL_START ("calibration start") state 560,
(b) S2_CAP_SEARCH ("capacitor search") state 530,
(c) S3_FREQ_SEARCH ("frequency search") 520, and
(d) S4_SLOPE_SEARCH ("slope search") state 510,
(e) before returning back to S0_IDLE state 550. In the S1_CAL_START state 550, the state machine waits for one wait period before entering S2_CAP_SEARCH ("capacitor search") state 530. The machine goes through iterative steps to determine VcoCap0 1010.

Following this, the state machine enters S3_FREQ_SEARCH ("frequency search") state 520 where Freq0 1020 is calculated. It finally enters S4_SLOPE_SEARCH ("slope search") 510 and computes FDiff16 1030. It then returns to S0_IDLE ("idle") state 550. Once calibrated for these parameters, when the synthesizer turns on with the indication of SynthOn 1060 signal, the state machine transitions between the S5_CALC_CAP ("calculate capacitor") 590 state and the S5_SYNTH_ON ("synthesizer on") 580 state. It can respond to channel updates due to frequency hops.

Figure 6:
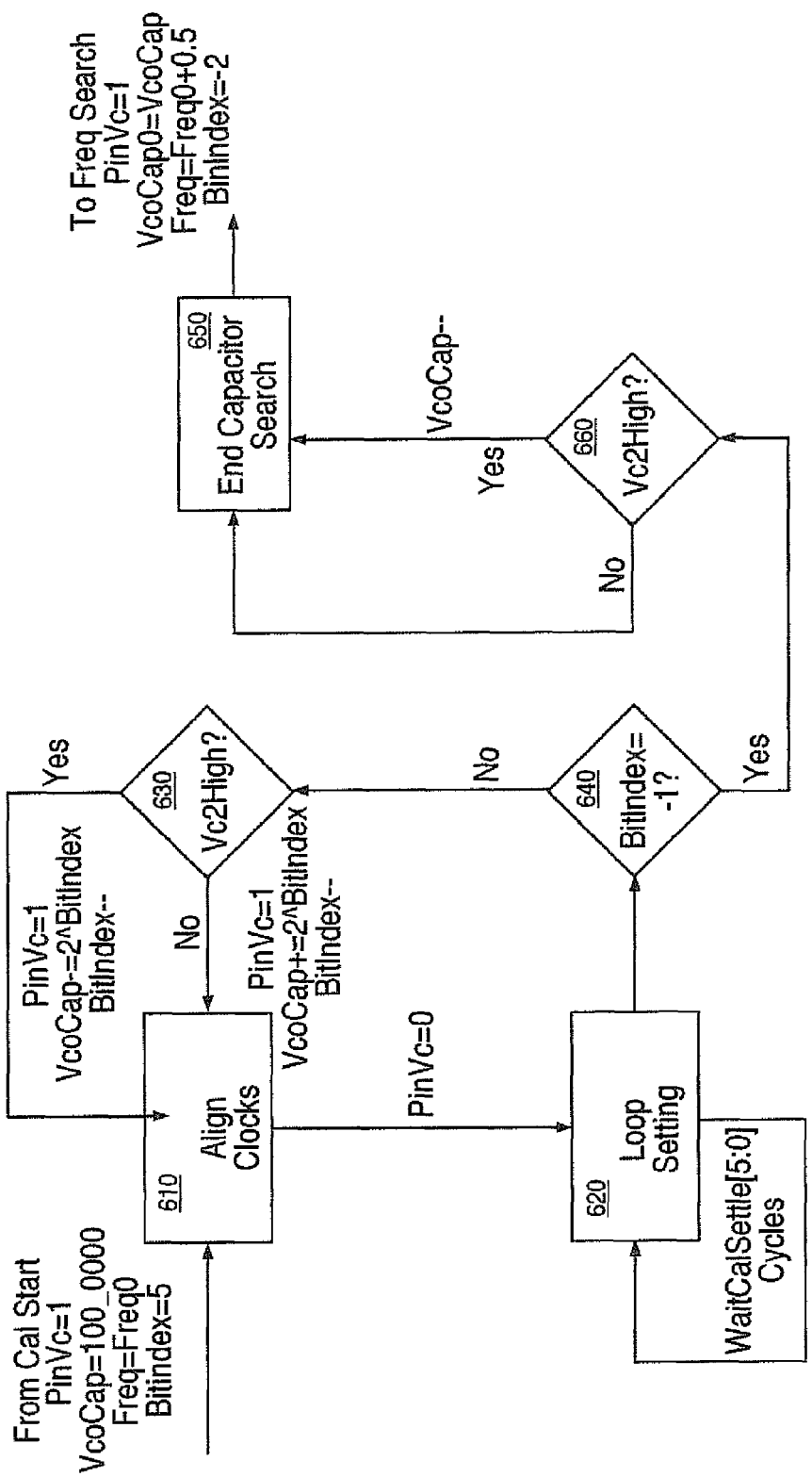
FIG. 6 shows a flow chart of calibration capacitor search process, where the first step of the synthesizer calibration process finds the capacitor value corresponding to a frequency just above the maximum frequency in the Bluetooth signal band.

In one embodiment of the invention, FIG. 6 provides a process description of the S2_CAP_SEARCH ("capacitor search") 530 process. This state is entered from the S1_CAL_START ("calibration start") 660 state. Initial parameters (guessed values) are provided to VcoCap and Freq 1120 parameters. In one embodiment, VcoCap is set to 100__0000, whereas Freq 1120 is set to Freq0 1020. BitIndex 1100 is assigned a value of five. The VCO control voltage Vc 345 is designated as Vc. The control signal pinVc 1110 is set to 1 on entrance from the S1_CAL_START ("calibration start") 560 state. This implies that the control voltage at the VCO input is set to Vmid 335, which in turn, sets the frequency to a fixed value. When pinVc 1110 is set to 0, the control voltage value Vc 345 changes, based on the PLL loop response. If the frequency is too low, the control voltage Vc 345 increases to compensate for the frequency error. Similarly, if the frequency is too high, the control voltage Vc 345 is decreased to compensate for the frequency error. The VCO capacitor controlling parameter is labeled as VcoCap 1130. Its start up value is labeled as VcoCap0 1010. The seven bit signal VcoCap 1130 is an input to the VCO (as shown in FIG. 3A and FIG. 3B).

A binary search is performed. The first step in S2_CAP_SEARCH ("capacitor search") 530 is to enter the state for aligning clocks 610. In this state, the state machine resets the feedback counter at the right time so that the feedback signal will be optimally aligned with the reference clock. This reduces the PLL closed-loop settling time, speeding up the calibration process. On its exit, pinVc 1110 signal is negated and the step for loop settling 620 is entered for a single wait unit. In step 640, a determination is made to check whether BitIndex 1100 is negative. If BitIndex is not negative, a test for the current value of Vc 345 is done to determine if Vc is too high in decision block 630. The VCO control voltage Vc 345 is compared with the voltage Vmid (the same voltage forced on Vc when pinVc=1). If the VCO control voltage Vc 345 is higher, it is considered too high, and if it is lower, it is considered to low. There can be two choices (a binary decision) because the Vc2High? step 630 has two outcomes. If there were two thresholds, there would be a third option (between the two thresholds) which is not shown in FIG. 6. If the VCO control voltage 345 is too high, the capacitor VcoCap 1130 is decremented by the quanta of 2 to the power of the BitIndex 1100. This is followed by decrementing of BitIndex 1100 by one and reassertion of pinVc 1110.

On the other hand, if Vc 345 is low, VcoCap 1130 is incremented by quanta of 2 to the power of the BitIndex 1100. The BitIndex is decremented by one after sampling, and pinVc 1110 is reasserted. This loop keeps repeating until BitIndex 1100 becomes negative. In one example, for a BitIndex of 5, the loop is executed five times. On exiting the loop (comprised of align clock 610, loop settling 620 and the two loop decision elements 640 and 630), VCO control voltage 345 is sampled once more to determine whether it exceeds the threshold Vhi 385. If it does not, the current capacitor value, VcoCap 1130, constitutes the searched value. If the VCO control voltage Vc 345 exceeds the threshold voltage Vhi 385, the current capacitor value VcoCap 1130 is decremented by one to obtain the searched capacitor value. The phase of the frequency search is entered, and VcoCap0 1010 is frozen to be the current VcoCap 1130 value. The Freq 1120 parameter is initialized (to Freq0+0.5), and BitIndex 1100 is set to negative 2 to indicate termination of this stage.

Figure 7:
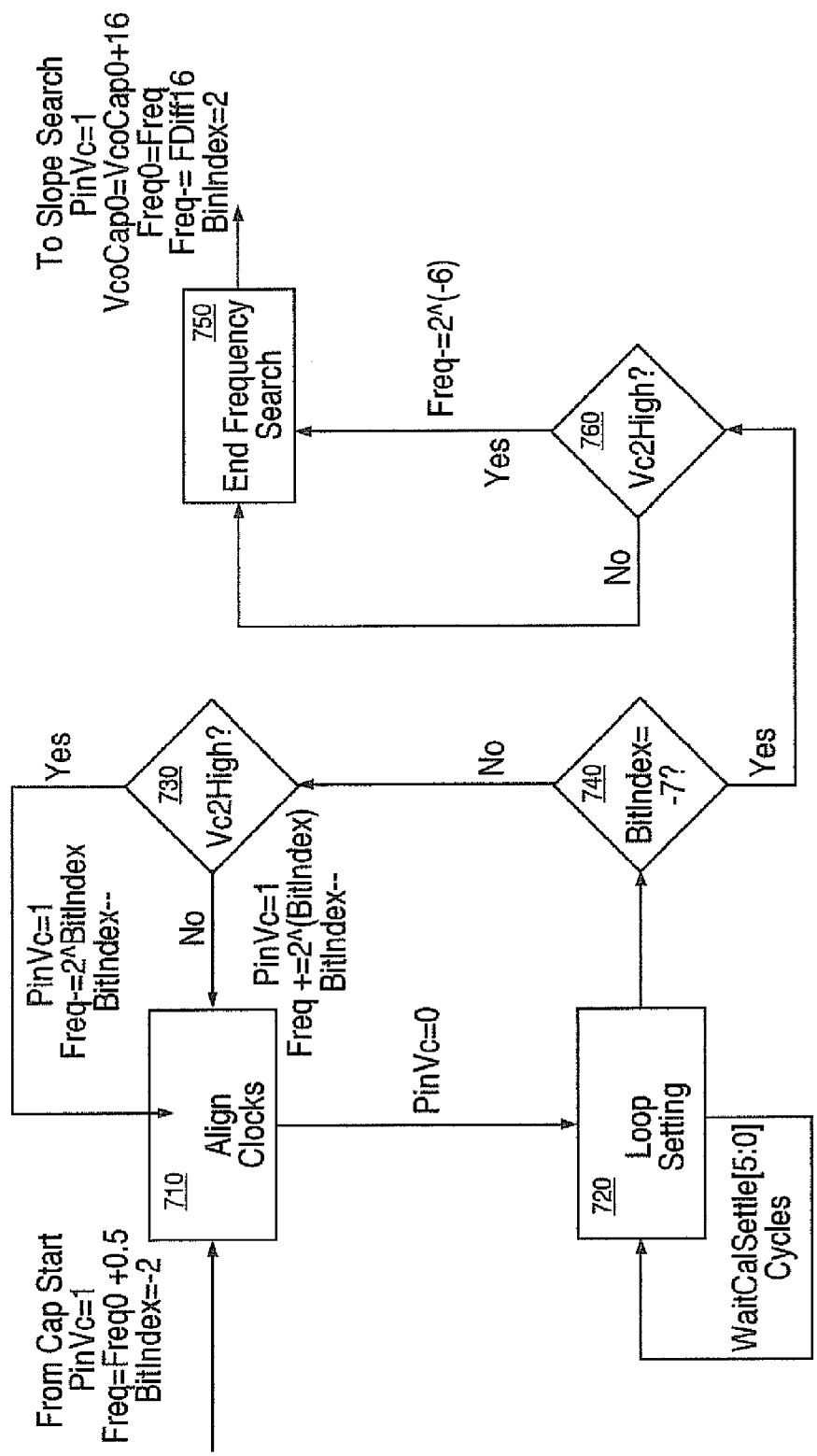
FIG. 7 shows a flow chart of the calibration "frequency search" process, where after selection of the capacitor, this process fine tunes the frequency to capacitor transition point.

In one embodiment of the invention, FIG. 7 indicates a similar search process for fine tuning the frequency. It is to be noted that to achieve a certain frequency from the synthesizer, either the VCO capacitor can be changed (when the PLL loop is open) or the divider ratio in the feedback path can be changed (when the PLL loop is closed). This process is entered after the completion of the S2_CAP_SEARCH ("capacitor search") process. The VCO control voltage Vc 345 is set to be the voltage Vmid 335 through the assertion of pinVc 1110. The Freq 1120 parameter of the feedback path, as well as BitIndex 1100, are initialized in the same manner as described above for the completion of the process of FIG. 6.

After the align clock block 710, the VCO control voltage is removed (pinVc=0) and a wait stage for loop settling is taken in block 720. Termination is checked for in decision block 740, after which VCO control voltage Vc 345 is sampled. If it is too high (Vc>Vmid), the VCO control voltage is turned on (pinVc=1); the frequency is reduced; and BitIndex 1100 is decremented. On the other hand, if the VCO voltage is too low (Vc<Vmid), the VCO control voltage Vc 345 is turned on (pinVc=1); the frequency is increased; and the BitIndex 1100 is reduced. This is followed by entering align clock block 710. This loop is repeated in this example for six times. After terminating the loop (comprising of align clock block 710, loop settling 720 and the two decision blocks 740 for BitIndex 1100), a final check is done in the decision block 760 for VCO control voltage Vc 345. If it is too high (Vc>Vmid), frequency (Freq) 1120 is decreased by the amount of 2 to the power of negative 6. If VCO control voltage Vc 345 is not too high (right setting achieved) the process ends. Thereupon, the VCO control voltage Vc 345 is turned on (pinVc=1); VCO capacitor VcoCap 1010 is increased by sixteen (as an example); Freq0 1020 is set to the searched frequency of Freq 1120; and the Freq 1120 parameter is decremented by the guess value of FDiff16 1030 to a value of (Freq0-FDiff16). The BitIndex 1100 is initialized to 2. The process continues to slope search.

Figure 8:
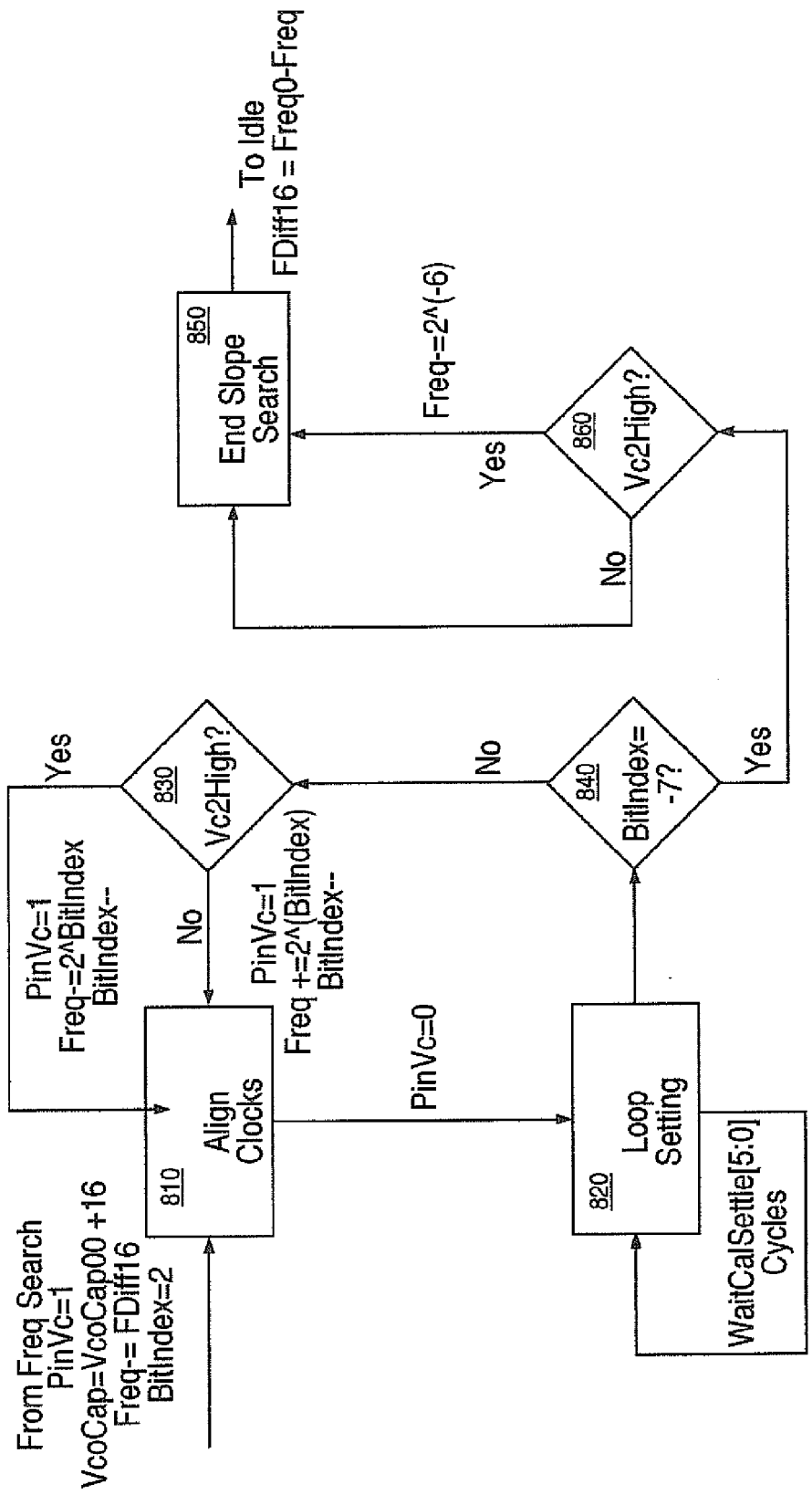
FIG. 8 shows a flow chart of the calibration "slope search" process, where the capacitor from the comparator transition point is changed by a power of two, frequency fine-tuned and difference in frequency calculated.

In one embodiment of the invention, FIG. 8 describes the slope search process. Similar to other processes, the align clock block 810 is entered first, with pinVc=1. This implies that the VCO control voltage Vc 345 is set to Vmid 335. On exit from align clock block 810, the voltage pinVc is set to 0, and loop settling block 820 is entered. A check for termination is performed in the decision block 840 based on the BitIndex 1100. This is followed by a check for the VCO control voltage Vc 345 in block 830. If the voltage is too high (Vc>Vmid), parameter Freq 1120 is reduced and BitIndex 1100 reduced. If the VCO control voltage is too low (Vc<Vmid), the parameter Freq 1120 is increased, and the BitIndex 1100 is reduced.

The process then enters the align clocks block 810. This loop executes ten times, as an example. The loop is comprised of align clock block 810, loop settling block 820 followed by decision block 840, and decision block 830 for termination of loop. After the termination of the loop, a last check is performed for the VCO control voltage Vc 345. If it is too high (Vc>Vmid), the Freq 1120 parameter is reduced by the quanta of 2 to the power of negative 6. If VCO control voltage Vc 345 is not too high, the process ends without any correction. The guessed parameter FDiff16 1030 is allocated the value of the difference between Freq0 1020 and that of Freq 1120. It should be appreciated that since capacitor was increased, Freq 1120, at this stage, is less than Freq0 1020.

With the execution of this step, the parameters Freq0 1020 (i.e., the outcome of the frequency search), VcoCap0 1010 (the outcome of the capacitor search) and FDiff16 1030 (the outcome of the slope search) are known. It is noteworthy that the process performing these steps requires just two points for determining the change of the capacitor, the corresponding change in frequency, and the slope for linear interpolation. Since these parameters are now known, the calibration process triggered by the assertion of SynthCal ends. The synthesizer state machine enters the S0_IDLE ("idle") state.

In one embodiment, after the completion of the calibration process, SynthCal 1070 is de-asserted, while SynthOn 1060 (to indicate that synthesizer is calibrated and the receive transmit traffic is enabled) is asserted. Initially, based on the ForceVcoCap 1075 signal, either the capacitor is calculated (ForceVcoCap 1075 is zero) or is skipped (ForceVcoCap 1075 is one). In the normal receive and transmit mode, the synthesizer alternates between the S5_CAL_CAP ("calculate capacitor") state and the S6_SYNTH_ON ("synthesizer on") state according to the pre-determined frequency hops.

Figure 9:
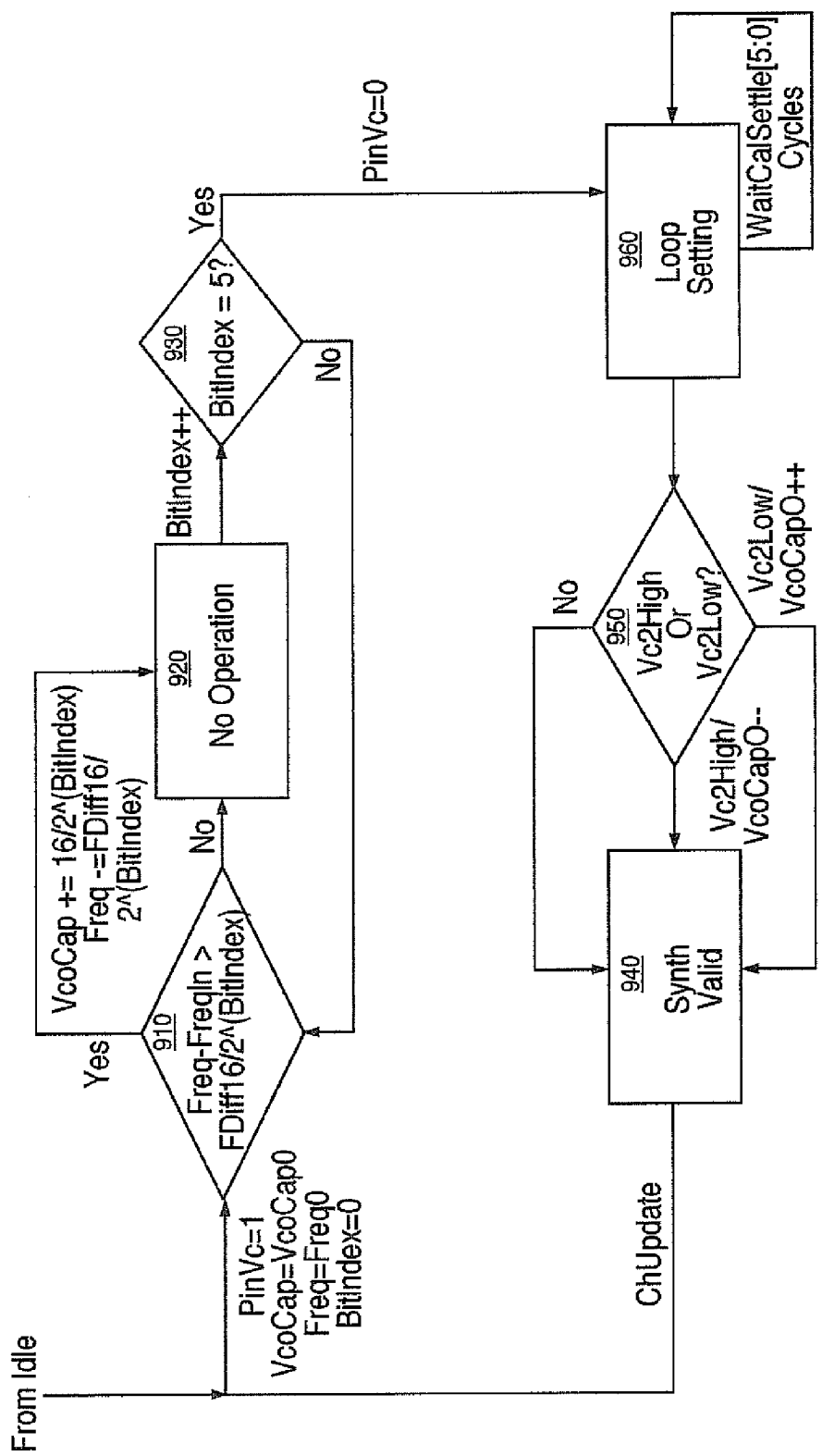
FIG. 9 shows a flow chart of the "calculate capacitor" process.

In one embodiment of the invention, FIG. 9 indicates the steps of the S5_CALC_CAP ("calculate capacitor") and S6_SYNTH_ON ("synthesizer on") states. Initially, "Freq" is initialized to "Freq0" at the beginning of the S5_CALC_CAP state, and "VcoCap" is initialized to "VcoCap0." In the S5_CALC_CAP ("calculate capacitor") step, which is entered from the S0_IDLE ("idle") state, the current frequency parameter Freq 1120 is compared with the hopped frequency FreqIn, which represents the desired channel (one of 79 Bluetooth hop frequencies from 2404 MHz to 2480 MHz, in 1 MHz steps. If the difference in frequency is positive and the quanta of difference exceeds FDiff16/2^(BitIndex) (BitIndex is zero initially), VCO capacitor VcoCap 1130 is increased by 16/2^(BitIndex), and the frequency of operation is reduced by FDiff16/2^(BitIndex). If the Freq 1120 parameter minus FreqIn is less than or equal to FDiff16/2^(BitIndex), no correction is needed. Appropriate steps are taken in block 920 to adjust to the new value of VcoCap 1130, and the BitIndex 1100 is incremented. In one example, the loop comprising decision block 990, no operation block 920 and decision block 930 is executed 5 times (BitIndex 1100 after increment becomes 5) before the loop is exited. The loop is settled by way of waiting in block 960, with pinVc=0 before proceeding to loop settling block 960. This step also initiates the S6_SYNTH_VALID (synthesizer on") state. A last check on VCO control voltage Vc 345 is done in decision block 960.

If the VCO voltage is too low (Vc<Vlo), VcoCap0 is increased by one quantum; whereas if it is too high (Vc>Vhi), it is decreased by one quantum. This change will affect the calculation of the capacitor value on the next frequency hop, not the current hop, so it does not disturb the frequency settling on the current hop. This is to accommodate slow variations in temperature which change the capacitance-to-frequency characteristic of the VCO, guaranteeing that it will always operate within the desired control voltage range (Vlo to Vhi). The synthesizer enters and remains in state S6_SYNTH_ON ("synthesizer on") until another frequency hop occurs, a recalibration is triggered, or a power on cycle is initiated. The thresholds for VCO control voltage Vc comparison for the calibration process are different than those used for VCO control voltage Vc comparison in the Normal Synth Operating Mode. This is the case because the VCO control voltage Vc is allowed to vary within a certain range. Generally, a single VcoCap setting will be good for 4 or so consecutive channels. On these channels, the VCO control voltage Vc has to increment as the channel is incremented in order for the VCO output frequency to increase. The Vhi and Vlo thresholds account for temperature drift. If the VCO characteristics change over temperature, the calibration results obtained at room temperature might no longer be valid. The entire linear fit is allowed to "move up and down" by adjusting VcoCap0 if the upper or lower threshold is breached. This enables the continued operation without performing a new calibration, for which there might not be time.

In another embodiment of this invention, instead of two point interpolation, a plurality of points for interpolation may be chosen to more closely track the frequency to capacitor relationship. In the Bluetooth band, the deviation from the linear relationship between the frequency and the capacitor is minimized by choosing a suitable second value for the capacitor. By incorporating more than two points of interpolation, the process similarly proceeds by changing the capacitor (e.g., by 32) and repeats the steps to calculate the corresponding frequency and slope. For hops in this region, the outcome parameters may be used to calculate the appropriate selection.

In another embodiment, the entire capacitor determination may be done in software running on a suitable machine capable of executing these instructions. While a hardware embodiment is described, there is no limitation that the same mechanisms could not be done in software.

Whereas this implementation is by way of example proposed for Bluetooth architecture involving frequency hops, it could be applied to any Radio frequency (RF) synthesizer in any frequency band. Alternative embodiments cover different bands and additional points of interpolation. By implementing a number of interpolations, embodiments of the invention may become viable for 5 GHz ISM band. Other embodiments of the invention may apply to future wireless products operating in completely different bands.

In the foregoing specification, embodiments have been described with reference to numerous specific details that may vary from implementation to implementation. Thus, the sole and exclusive indicator of what is the invention, and is intended by the applicant to be the invention, is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A method of setting a frequency of a frequency synthesizer in a system comprising:
   setting a first value for a capacitor to control the frequency synthesizer to generate a signal at a first frequency of the frequency synthesizer;
   setting a second value for the capacitor to control the frequency synthesizer to generate the signal at a second frequency;
   determining a first mathematical relation between the first value of the capacitor and the first frequency;
   determining a second mathematical relation between the second value of the capacitor and the second frequency;
   using the first mathematical relation and the second mathematical relation to determine values of the capacitor for a range of frequencies which the frequency synthesizer can be set to generate.

2. The method of claim 1 wherein a band of operation comprises at least one of Bluetooth, 5 GHz or 60 GHz.

3. The method of claim 1, wherein the first frequency is set higher than a band of operation.

4. The method of claim 1, wherein the first frequency and the second frequency are fine tuned to find a point of transition of the value of the capacitor.

5. The method of claim 1, wherein the first value or second value of the capacitor is determined by a binary search.

6. The method of claim 1, wherein the frequency synthesizer includes a state machine.

7. The method of claim 1, wherein a difference between the first value of capacitor and second value of capacitor comprises a power of two.

8. The method of claim 7 wherein the power of two comprises 16.

9. The method of claim 1, wherein the first and second mathematical relations comprise linear relations.

10. The method of claim 1 wherein the system comprises a radio frequency transceiver.

11. A frequency synthesizer apparatus in a system comprising:
   a voltage controlled oscillator (VCO) with a varactor;
   a phase comparator;
   a feedback path between the VCO and the phase comparator with a frequency divider;
   a first state machine, wherein the first state machine comprises elements to set a first value of a capacitor associated with the VCO, determine a first frequency for the first value of the capacitor, set a second value of the capacitor, determine a second frequency for the second value of the capacitor, determine a first mathematical relation between the first capacitor value and the first frequency, and determine a second mathematical relation between the second capacitor value and the second frequency; and
   a second state machine, wherein the second state machine comprises elements for using the first mathematical relation and the second mathematical relation to calculate the capacitor value for a range of frequencies which the frequency synthesizer can be set to generate.

12. The apparatus of claim 11, wherein the first and second mathematical relations comprise linear relations.

13. The apparatus of claim 11, wherein a band of operation comprises at least one of Bluetooth, 5 GHz or 60 GHz.

14. The apparatus of claim 11, wherein the first frequency is set higher than a band of operation.

15. The apparatus of claim 11, wherein the first frequency and the second frequency are fine tuned to find a point of transition of the value of the capacitor.

16. The apparatus of claim 11, wherein the first value or second value of the capacitor is determined by a binary search.

17. The apparatus of claim 11, wherein the varactor comprises a MOS transistor.

18. The apparatus of claim 11, wherein a difference between the first value of the capacitor and second value of the capacitor comprises a power of two.

19. The apparatus of claim 18, wherein the power of two comprises 16.

20. The apparatus of claim 11, wherein the system comprises a radio frequency transceiver.

21. The apparatus of claim 11, wherein:
   during a calibration mode of the frequency synthesizer apparatus, the first state machine comprises elements to set the first value of the capacitor associated with the VCO, determine the first frequency for the first value of the capacitor, set the second value of the capacitor, determine the second frequency for the second value of the capacitor, determine the first mathematical relation between the first capacitor value and the first frequency, and determine the second mathematical relation between the second capacitor value and the second frequency; and
   during the calibration mode of the frequency synthesizer apparatus, the second state machine comprises elements for using the first mathematical relation and the second mathematical relation to calculate the capacitor value for the range of frequencies which the frequency synthesizer can be set to generate.

22. The apparatus of claim 11, wherein the first state machine comprising elements to set the second value of the capacitor comprises the first state machine comprising elements to increase a setting for the capacitor by a predefined power to the second value to control the frequency synthesizer apparatus to generate a signal at the second frequency.

23. One or more non-transitory machine-readable storage media having instructions stored therein, which when executed by one or more processors causes the one or more processors to perform operations that comprise:
   setting a first value for a capacitor to control a frequency synthesizer to generate a signal at a first frequency of the frequency synthesizer;
   setting a second value for the capacitor to control the frequency synthesizer to generate the signal at a second frequency;
   determining a first mathematical relation between the first value of the capacitor and the first frequency;
   determining a second mathematical relation between the second value of the capacitor and the second frequency;
   using the first mathematical relation and the second mathematical relation to determine values of the capacitor for a range of frequencies which the frequency synthesizer can be set to generate.

24. The machine-readable storage media of claim 23, wherein the first frequency is set higher than a band of operation.

25. The machine-readable storage media of claim 23, wherein the first frequency and the second frequency are fine tuned to find a point of transition of the value of the capacitor.

26. The method of claim 1, wherein said determining and using the first mathematical relation and the second mathematical relation to determine values of the capacitor for the range of frequencies which the frequency synthesizer can be set to generate is performed during a calibration mode of the frequency synthesizer.

27. The method of claim 1, wherein said setting the second value for the capacitor to control the frequency synthesizer to generate the signal at the second frequency comprises increasing a setting for the capacitor by a predefined power to the second value to control the frequency synthesizer to generate the signal at the second frequency.

* * * * *